United States Patent [19]

Gotwald et al.

[11] Patent Number: 4,768,581

[45] Date of Patent: Sep. 6, 1988

[54] COOLING SYSTEM FOR SEMICONDUCTOR MODULES

[75] Inventors: Charles A. Gotwald; Sevgin Oktay, both of Poughkeepsie; Ajay Sharma, Pleasant Valley; Vijay Sonnad, Kingston; Arthur R. Zingher, White Plains, all of N.Y.

[73] Assignee: International Business Machines Corporation, Armonk, N.Y.

[21] Appl. No.: 34,360

[22] Filed: Apr. 6, 1987

[51] Int. Cl.⁴ .............................................. F28F 3/06
[52] U.S. Cl. .................................. 165/80.3; 361/384; 165/903
[58] Field of Search ............. 165/80.3, 80.2, 903, 165/908; 361/384, 383, 386; 357/82

[56] References Cited

U.S. PATENT DOCUMENTS

| | | | |
|---|---|---|---|
| 2,445,582 | 7/1948 | Melville | 361/384 |
| 2,532,858 | 12/1950 | Rinia | 165/80.3 |
| 3,843,910 | 10/1974 | Ringuet | 317/100 |
| 3,961,666 | 6/1976 | Suzuki et al. | 165/129 |
| 3,967,874 | 7/1976 | Calabro | 361/384 |
| 3,993,123 | 11/1976 | Chu et al. | 165/80 |
| 4,167,771 | 9/1979 | Simons | 165/80.2 |
| 4,226,281 | 10/1980 | Chu | 165/80.2 |
| 4,245,273 | 1/1981 | Feinberg et al. | 361/382 |
| 4,254,431 | 3/1981 | Babuka et al. | 357/82 |
| 4,296,455 | 10/1981 | Leaycraft et al. | 361/383 |
| 4,312,012 | 1/1982 | Frieser et al. | 357/82 |
| 4,365,665 | 12/1982 | Nakamura | 165/80.3 |
| 4,415,025 | 11/1983 | Horvath | 165/185 |
| 4,489,363 | 12/1984 | Goldberg | 361/383 |
| 4,498,530 | 2/1985 | Lipschutz | 165/185 |
| 4,561,040 | 12/1985 | Eastman et al. | 361/385 |
| 4,620,216 | 10/1986 | Horvath | 357/81 |
| 4,682,651 | 7/1987 | Gabuzda | 165/80.3 |

FOREIGN PATENT DOCUMENTS 2906363 8/1980 Fed. Rep. of Germany.

OTHER PUBLICATIONS

IBM Technical Disclosure Bulletin, vol. 22, No. 2, 696–697, (Jul. 1979).
IBM Technical Disclosure Bulletin, vol. 27, No. 7B, 4278, (Dec. 1984).
IBM Technical Disclosure Bulletin, vol. 28, No. 7, 3058–3059, (Dec. 1985).
IBM Technical Disclosure Bulletin, vol. 29, No. 2, 768–769, (Jul. 1986).

Primary Examiner—Ira S. Lazarus
Assistant Examiner—Sue Hagerman
Attorney, Agent, or Firm—Ira D. Blecker

[57] ABSTRACT

A cooling structure for a semiconductor package wherein the cooling fluid is circulated over the cooling fins over short distances. The fluid flow is separated into multiple flow streams, passed over the fins for short distances and exhausted.

18 Claims, 2 Drawing Sheets

COOLING SYSTEM FOR SEMICONDUCTOR MODULES

BACKGROUND INFORMATION

This invention relates to heat transfer mechanisms, and more particularly to an improved heat transfer mechanism for removing heat generated from high powered integrated circuit devices.

A basic approach for cooling semiconductor devices is using a liquid for removing heat. A liquid cooling approach is to conduct heat from the device through a solid conductor, such as a piston or the like, that is in contact with both the device and a liquid cooled cold plate. Such a system is described in U.S. Pat. No. 4,245,273. An improvement is described and claimed in U.S. Pat. No. 4,312,012, wherein liquid is circulated through fins and elements that actually contact the backside of the devices. The cooling liquid is carried to the devices with flexible conduits.

Liquid cooling allows very high cooling density. Unfortunately, it tends to be expensive. It requires plumbing and a pump. If a cold water source and warm water drain are not available, then the system must also include a chiller to transfer the heat to an air stream. Liquid cooling often involves water, which requires design effort to prevent it from contacting and corroding the electronics.

Air cooling offers better economy. However its cooling performance is limited. Air has a low density times heat capacity. Therefore, substantial cooling requires substantial air flow. For most heat sinks, this requires substantial air speed, fan pressure, and noise. Conversely, allowable noise and fan pressure often limit air cooling, especially for a large module with many densely packed chips.

Another problem with air cooling is that as the air passes over a length of cooling fins it becomes hotter. Thus, the degree of cooling is not uniform over the surface of the substrate supporting the devices. Systems for air cooling of semiconductor devices are shown in U.S. Pat. Nos. 3,961,666, 4,489,363 and 3,843,910. An improvement in forced air cooling is provided with "impingement" cooling. This system forces air directly downwardly against cooling studs or fins attached to a cooling plate. Impingement cooling systems are shown in U.S. Pat. Nos. 4,296,455 and 4,620,216.

SUMMARY OF THE INVENTION

An object of this invention is to provide an improved heat sink for cooling a semiconductor module with forced fluid flow.

Another object of this invention is to provide a highly efficient cooling system for an electronic module that functions with a low forced air pressure.

Yet another object of this invention is to provide a heat sink which can be simply redesigned for a different sized module and which operates at the same forced fluid pressure.

In accordance with the aforementioned objects there is presented an improved system for cooling electronic elements. The system has a base element adapted to receive heat from electronic elements, a plurality of spaced fins mounted on the base element, and at least one elongated duct means mounted on the spaced fins. The duct means is provided with a pair of flat bottom wall members in engagement with the upper ends of the fins, and an upwardly bulged top wall member joined to the outer edges of the pair of bottom wall members. The duct means has at least one open end. A plenum is mounted over the base member for supplying cooling fluid to the heat sink. The system in operation is adapted to flow cooling fluid through the plenum, inwardly through the fins, upwardly to enter the duct means, and subsequently be exhausted through the duct means. Alternatively, this cooling fluid flow can be in the reverse direction.

BRIEF DESCRIPTION OF THE DRAWINGS

The details of our invention will be described in connection with the accompanying drawings in which.

DETAILED DESCRIPTION OF THE INVENTION

Figure 1:
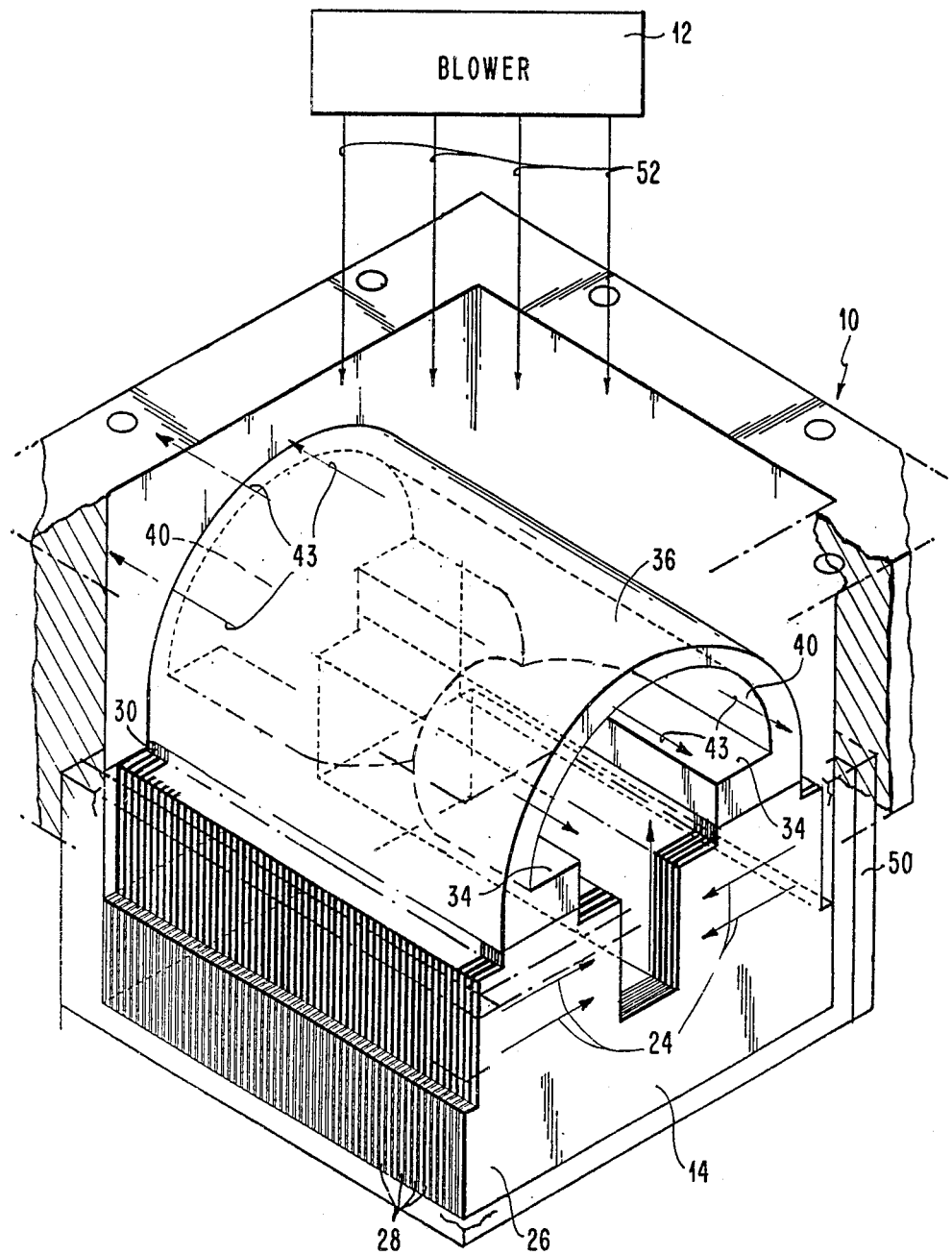
FIG. 1 is a perspective view in broken section that illustrates a preferred specific embodiment of the cooling system of our invention.
Figure 2:
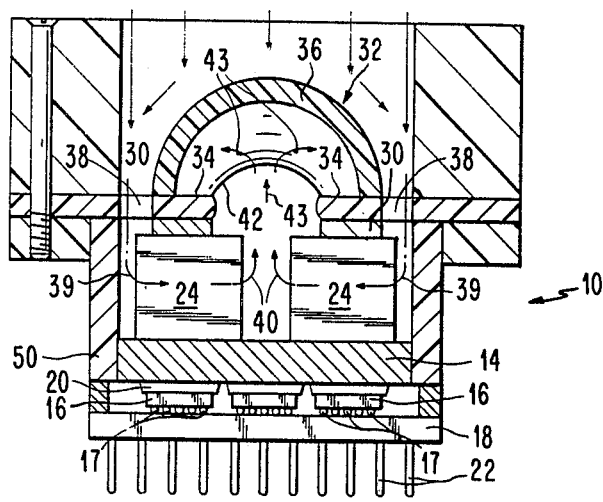
FIG. 2 is an elevational view in section that illustrates a preferred specific embodiment of the cooling system of our invention.
Figure 3:
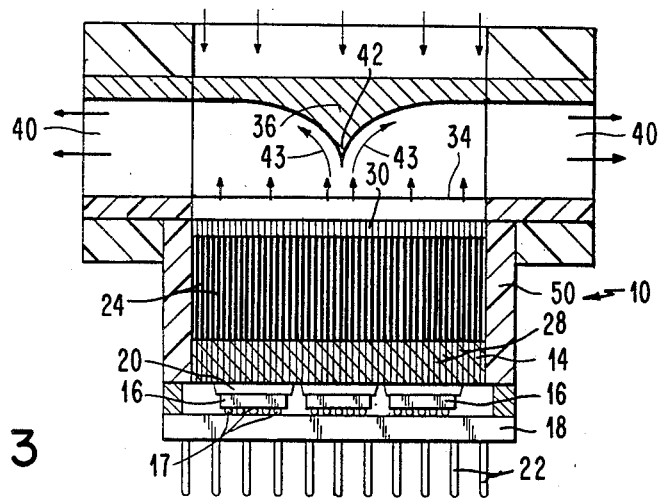
FIG. 3 is a sectional view taken on 3—3 of FIG. 2.

With reference to the drawings, FIG. 1 illustrates the structural details of a preferred specific embodiment of cooling system 10 that uses a source of cooling fluid, normally air, from blower 12. The fluid is normally at room temperature but can be chilled if necessary to meet the requirements of a particular cooling application. Cooling system 10 has a base element 14 that is located to receive heat from operating electronic elements, as more clearly shown in FIGS. 2 and 3. Electronic elements, such as integrated circuit semiconductor devices, are mounted on substrate 18 which produce heat during operation. This heat must be removed to assure that the devices will operate within their design constraints, and to prevent destruction from overheating. The devices 16 do conduct some heat through solder terminal 17 to substrate 18, but this is inadequate cooling by itself. The major portion of the heat generated by the devices must be removed from the back or top side. Heat is removed from the back side of the devices to base element 14 by any suitable structure with a suitable high thermal conductivity. One technique is to place a layer of thermal grease 20 between the device and base element. However, other structures can be used, as for example, spring biased pistons mounted in the base element, as shown in U.S. Pat. No. 3,993,123, flexible disks of metal as shown in U.S. Pat. No. 4,415,025, sets of interleaved contacting fins as shown in U.S. Pat. No. 4,498,530, etc. The electronic devices can be connected to the substrate with any suitable structure, such as solder bonding, decal bonding, ultrasonic bonded wires and the like, as long as some means with a high thermal conductance is provided to convey the heat from the device to the base element 14.

The substrate 18 has a metallurgy system to provide the necessary electrical circuitry for interconnecting devices 16 and I/O pins 22. Substrate 18 is conventional and the structure thereof is not a part of this invention.

Mounted on the upper surface of base element 14 is a pair of rows of spaced parallel fins 24. Fins 24 are preferably formed of a material with a high thermal conductivity such as copper. In the preferred embodiment, substrate 14 and fins 24 are formed of a plurality of flat elements 26, as shown most clearly in FIGS. 1 and 3. In the base element, spacer elements 28 are positioned between elements 26 to form a laminated solid base. Preferably, narrow spacers 30 are provided between the flat elements 26 on the top ends of the fins to form a solid upper wall. The spacers 28 and 30 are also preferably formed of material having a high heat conductivity. The fin thickness sets the distance scale. The ratio of air gap over fin thickness should be between 0.5 and 4, with an optimum about 2.

An elongated duct 32 is mounted on the tops of the pairs of rows of fins 24 with the longitudinal axis thereof perpendicular to the fins. The duct 32 is made up of a pair of bottom wall members 34 that are located on the top ends of the fins, and a bulged or arched top wall 36 spanning the pair of rows of fins and joined to walls 34. The shape of the top wall 36 can be any suitable shape but is preferably designed to divert downwardly flowing fluid to the outside spaces 38, as most clearly shown in FIG. 2 by arrows 39. The fluid pressure will force the fluid across the fins 24 upwardly to duct 32 and transversely out of exits 40 as indicated by arrows 43 in FIG. 2. Preferably, duct 32 has a flow splitting structure 42 shown in FIG. 3, which causes the fluid to diverge outwardly as indicated by arrows 43. Duct 32 is preferably formed of a material with a low heat conductivity. The aforedescribed structure can be modified if desired. For example, the top wall 36 can be joined directly to the tops of fins 24 where the combination of the top of the fins and spacers 30 provide an impervious wall. Alternatively, walls 34 can be positioned directly on top of fins 24 without any spacer elements 30. Further, base element 14 can be a solid element with the fins 24 joined thereto by any suitable means.

Figure 4:
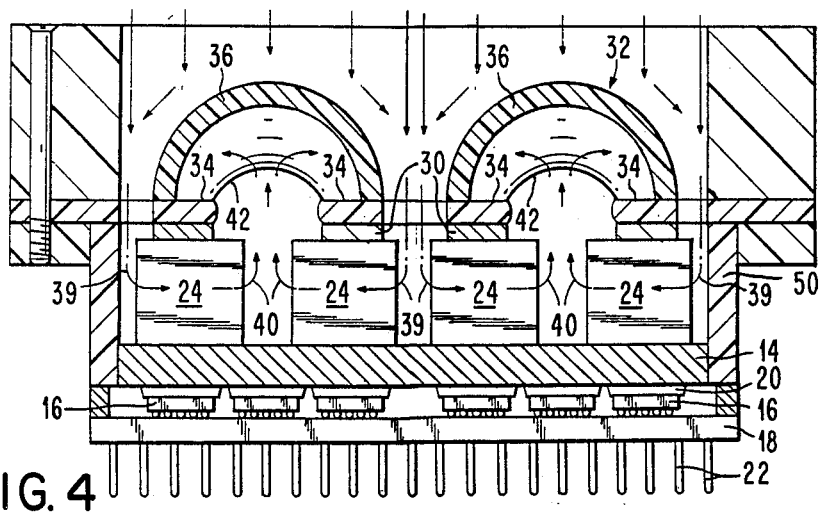
FIG. 4 is an elevational view in section that illustrates a multiple unit design of a preferred specific embodiment of the invention.

A plenum 50 is mounted on or over substrate 14 to direct fluid, indicated by arrows 52 from blower 12 across fins 24 and out of duct 32. The system of our invention results in a relatively low pressure drop across fins 24. The short flow path and parallel flow of the cooling fluid results in very effective and efficient removal of heat from the base element 14. In a redesign of a larger module, more rows of fins can be provided as shown in FIG. 4. When the same sized fins are provided, the pressure drop across the fins will be the same irrespective of the size of the module. The size of the blower can easily and simply be enlarged to provide the necessary additional air flow keeping the pressure drop the same. The larger module will be cooled with the same efficiency, because air flows in parallel over all fins. By contrast, in prior art designs, air flows over multiple fins in series, which heats the downstream air and degrades downstream cooling, and which requires substantial air pressure.

This invention covers several other embodiments. The air flow direction can be reversed, to enter on the side and to exit on the top.

In another variation, all the fins in a module might be fabricated as one overall fin array. Thus, air would enter and leave at various places on the top of this large array. In order to allow easier air entrance and exit, notches might be made in the array. Also, the spacer sheets should be shaped to assist the air flow.

The base and fin structure can be fabricated starting with thin conductive sheets, such as 0.25 mm Cu sheets. With a suitable die, fin strips are stamped out with suitable notches. With other dies, the top and bottom spacers are stamped out. These strips are then stacked together, and bonded (e.g. braze or adhesive bond) into one overall composite structure.

While the present invention has been particularly shown and described with reference to preferred embodiments therefor, it will be understood by those skilled in the art that the foregoing and other changes in form and detail may be made therein without departing from the spirit and scope of the present invention, as defined in the appended claims.

What is claimed is:

1. An improved system for cooling electronic elements comprising
   a base element adapted to receive heat from electronic elements,
   a plurality of spaced fins mounted on said base element,
   at least one elongated duct means mounted over said spaced fins, said duct means provided with a pair of flat bottom wall members in engagement with the upper ends of said fins, and an upwardly bulged top wall member joined to the outer edges of said pair of bottom wall members, said duct means having at least one open end,
   a plenum mounted on said base member for conveying cooling fluid through said system,
   said system in operation adapted to pass cooling fluid through said plenum, then through said fins and then through said duct means.

2. The system of claim 1 wherein said base element and said fins are formed of Cu.

3. The system of claim 2 wherein base element is a laminated structure.

4. The system of claim 3 wherein a plurality of unitary flat elements form both the base element and the fins, and said base element further including flat members sandwiched between said unitary flat elements.

5. The system of claim 4 which further includes flat spacer elements sandwiched between the upper ends of said flat members.

6. The system of claim 5 wherein said spacer members and the upper ends of said flat members form said wall members of said duct means.

7. The system of claim 6 wherein said top wall member has an arcuate cross sectional configuration.

8. The system of claim 1 wherein said fins are comprised of at least one pair of rows of spaced parallel fins.

9. The system of claim 1 wherein said fins are multiple pairs of rows of spaced parallel fins mounted on said base member.

10. The system of claim 1 wherein the ratio of the distance between said fins over the fin thickness is in the range of 0.5 to 4.

11. The system of claim 10 wherein the thickness of said fins is of the order of 0.25 mm.

12. The system of claim 1 wherein said duct means is made of a material with a low heat conductivity.

13. The system of claim 1 wherein said duct means is open at both ends for exhausting cooling fluid.

14. The system of claim 13 wherein a flow splitting structure is provided in said duct means to direct cooling fluid in opposite directions.

15. The system of claim 8 wherein a spacing is provided between the ends of said fins and the walls of said plenum, said spacing being in the range of 2 to 5 mm.

16. The system of claim 15 wherein the spacing of the ends of said fins from the walls of said plenum is on the order of 3 mm.

17. The system of claim 1 which further includes apertures in the bottom side of said base member, and pistons movably mounted in said aperture for contacting electronic elements, said pistons conducting heat from said electronic elements to said base member.

18. A system for cooling electronic elements comprising:
- a base element adapted to receive heat from electronic elements,
- a plurality of fins mounted on said base element,
- a blower to direct cooling gas downwardly toward said base element,
- a means to funnel said cooling gas to said fins,
- a duct means distinct from said funnel means over said fins to convey said cooling gas away from said fins,
- said system in operation adapted to move cooling gas through said funnel means, then inwardly between said fins, and then exhaust said gas upwardly and transverse to said fins through said duct means.

* * * * *